(12) United States Patent
Konrad et al.

(10) Patent No.: US 7,065,732 B1
(45) Date of Patent: Jun. 20, 2006

(54) METHOD TO REDUCE THE POWER CONSUMPTION OF LARGE PLAS BY CLOCK GATING GUIDED BY RECURSIVE SHANNON DECOMPOSITION OF THE AND-PLANE

(75) Inventors: Victor Konrad, Sunnyvale, CA (US); Vivek Joshi, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 694 days.

(21) Appl. No.: 09/678,175

(22) Filed: Sep. 28, 2000

(51) Int. Cl.
*G06F 17/50* (2006.01)
*H03K 17/693* (2006.01)
*H03K 19/177* (2006.01)

(52) U.S. Cl. .................. 716/16; 716/1; 716/4; 326/37; 326/38; 326/39; 326/41

(58) Field of Classification Search .................. 716/4, 716/16; 711/130; 710/3; 702/75; 398/5; 365/230.03; 326/41, 37–39
See application file for complete search history.

(56) References Cited

U.S. PATENT DOCUMENTS

| | | | |
|---|---|---|---|
| 4,839,539 A * | 6/1989 | Takata et al. ................. | 326/38 |
| 5,311,079 A * | 5/1994 | Ditlow et al. ................. | 326/39 |
| 6,038,386 A * | 3/2000 | Jain ............................. | 716/16 |
| 6,433,577 B1 * | 8/2002 | Wang et al. ................... | 326/37 |
| 6,442,732 B1 * | 8/2002 | Abramovici et al. ........... | 716/4 |
| 6,492,835 B1 * | 12/2002 | Shau ............................. | 326/41 |
| 6,804,812 B1 * | 10/2004 | Osann et al. .................. | 716/16 |

OTHER PUBLICATIONS

Katkoori et al., "Simulation based architectural power estimation for PLA-based controllers", Aug. 1996, Low Power Electronics and Design, 1996, International Symposium on, 12-14 pp. 121-124.*

Khatri et al., "Cross-talk immune VLSI design using a network of PLAs embedded in a regular layout fabric", Nov. 2002, Computer Aided Design, 2000, ICCAD-2000, IEEE/ACM International Conference on, pp.: 412-418.*

* cited by examiner

*Primary Examiner*—A. M. Thompson
*Assistant Examiner*—Helen Rossoshek
(74) *Attorney, Agent, or Firm*—Blakely, Sokoloff, Taylor & Zafman LLP

(57) ABSTRACT

A method that includes steps for determining an optimum splitting variable and dividing a programmable logic array (PLA) into a first sub-PLA and a second sub-PLA based on the splitting variable is presented. The method also provides for gating logic to be applied to the first sub-PLA and the second sub-PLA. Power consumption is then controlled in the first sub-PLA and the second sub-PLA so only one of the first sub-PLA and the second sub-PLA contributes to power consumption. In another embodiment, a PLA be recursively divided into a plurality of sub-PLAs.

30 Claims, 7 Drawing Sheets

METHOD TO REDUCE THE POWER CONSUMPTION OF LARGE PLAS BY CLOCK GATING GUIDED BY RECURSIVE SHANNON DECOMPOSITION OF THE AND-PLANE

BACKGROUND OF THE INVENTION

1. Field of the Invention

The invention relates to programmable logic arrays (PLAs), and more particularly to power consumption reduction in PLAs by using recursive decomposition and clock gating of an original PLA.

2. Background Information

In modern very large scale integration (VLSI) design, programmable logic arrays (PLAs) are logic structures that are typically implemented in the design. PLAs are also currently used in many microprocessors, such as the Intel Itanium™ processor. Many of the current generation processors employ dynamic PLAs for random-logic designs.

Large PLAs consume significant power due to the charging and discharging of large amounts of capacitance almost every clock. Most of this power consumption occurs from the capacitance of the "product" wires and the diffusion of the transistors connected to them. Due to the emphasis on power consumption reduction in microprocessor designs, minimizing the frequency of charging/discharging of PLAs becomes important in reducing power consumption.

Many designers implement computer aided design (CAD) tools to help minimize PLAs. One such tool, ESPRESSO, is a popular CAD tool that is used widely by designers to minimize PLAs. ESPRESSO uses a two-level representation of a boolean function as an input, and produces an optimized equivalent representation. When ESPRESSO is applied to a set of logic equations that define the outputs as sums-of-products of the inputs, it transforms the original set of equations into a functionally equivalent set, but a set with fewer products and literals. The reduction of products and literals, when applied to PLA design, reduces the number of product wires and transistors in the circuit realization. ESPRESSO uses heuristics to compute and select prime implicants. Therefore, the output is not guaranteed to be the best possible solution. In some cases, the output will be optimal, or nearly so.

In most, however, it will only be adequate. With the result of reduction of product wires and transistors in PLA design by using ESPRESSO, a power consumption reduction is realized, but not fully optimized.

DETAILED DESCRIPTION

The invention generally relates to a method for applying partitioning logic to partially optimized PLAs which, based on the values assumed by the inputs of the PLAs at any evaluation, cuts off power to selected subsets of the PLA. Referring to the figures, exemplary embodiments of the invention will now be described. The exemplary embodiments are provided to illustrate the invention and should not be construed as limiting the scope of the invention.

For ease of discussion, some notation and theory will first be described. A PLA is merely a set of two-level logic functions in n boolean input variables. By two-level logic, we mean AND and OR. An example of a set of boolean equations comprising a PLA are shown below:

$$
\begin{aligned}
m1 &= \phantom{x1 \text{ AND }} x2' \text{ AND } x3 \phantom{\text{ AND } x4'} \text{ AND } x5' \\
m2 &= x1 \text{ AND } x2' \text{ AND } x3' \text{ AND } x4 \\
m3 &= \phantom{x1 \text{ AND }} x2 \phantom{\text{ AND } x3'} \text{ AND } x4' \text{ AND } x5 \\
m4 &= \phantom{x1 \text{ AND }} x2 \phantom{\text{ AND } x3'} \text{ AND } x4 \phantom{\text{ AND } x5'} \text{ AND } x6 \\
y1 &= m2 \\
y2 &= m1 \text{ or } m3 \\
y3 &= m2 \phantom{\text{ or } m3} \text{ or } m4 \\
y4 &= m1 \phantom{\text{ or } m3} \text{ or } m4
\end{aligned}
$$

For the above example set of equations, there are six (n=6) input boolean variables, x1, x2, x3, x4, x5 and x6, and four (4) products, m1, m2, m3 and m4. The set of products is referred to as the AND plane. The boolean variables y1, y2, y3, and y4 are the outputs. The set of equations defining the outputs are referred to as the OR plane. The same equations defining an example PLA expressed in the cod notation is shown below in Table 1.

TABLE 1

.cod representation of a sample PLA

| | x1 | x2 | x3 | x4 | x5 | x6 | | y1 | y2 | y3 | y4 |
|---|---|---|---|---|---|---|---|---|---|---|---|
| m1 | — | 0 | 1 | — | 0 | — | / | 0 | 1 | 0 | 1 |
| m2 | 1 | 0 | 0 | 1 | — | — | / | 1 | 0 | 1 | 0 |
| m3 | — | 1 | — | 0 | 1 | — | / | 0 | 1 | 0 | 0 |
| m4 | — | 1 | — | 1 | — | 1 | / | 0 | 0 | 1 | 1 |

In the .cod representation of the sample PLA, one will notice that the AND plane contains three types of elements. A 0 (zero) in row i and column j denotes that variable j participates in product i in uncomplemented form. A 1 (one) in row i column j position indicates that the variable j participates in product i in complemented form. A - (dash) in the row i column j signifies that variable j does not participate in product i. The dash is also known as a "don't care."

Figure 1:
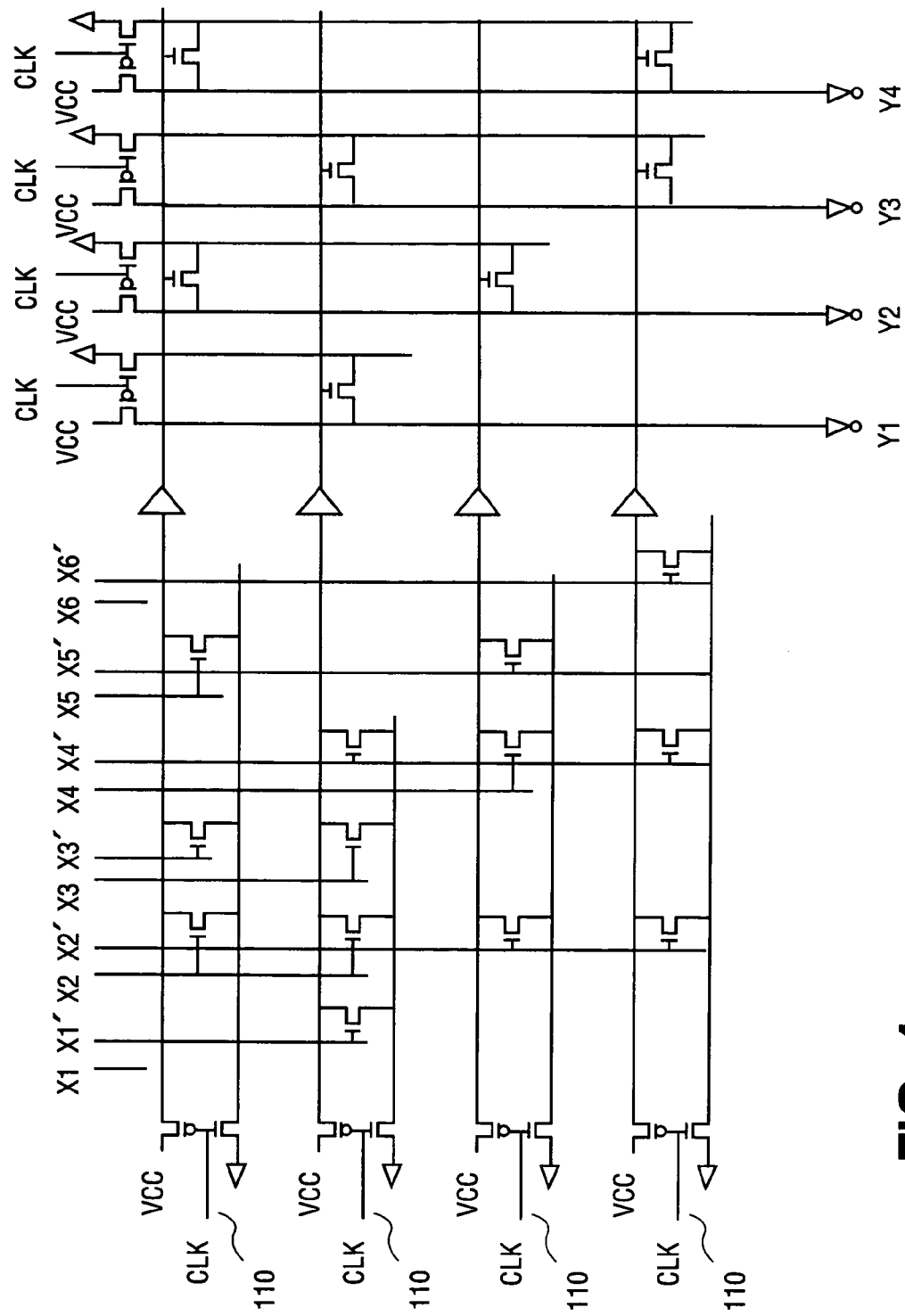
FIG. 1 illustrates a typical topological circuit of an example programmable logic array (PLA).

In the OR plane, a one in row i and column k signifies that the $i^{th}$ product participates in forming the $k^{th}$ output. FIG. 1 illustrates a typical realization circuit topology of the example PLA developed from the previous illustrated equations and the .cod representation in Table 1.

The Shannon decomposition theorem asserts that a boolean function F in n boolean variables x1, x2, . . . xn can be represented as shown below:

$$F(x1, x2, \ldots xn) = (x1 \text{ AND } g(x2, x3 \ldots xn)) \text{ OR } (x1' \text{ AND } h(x2, x3 \ldots xn))$$

Where g and h are boolean functions in the n−1 boolean variables x2, x3, . . . xn. One skilled in the art will realize that x1 could be replaced with xi. With xi replacing x1, functions g and h are functions of (n−1) which are the original n variables with xi deleted. The variable xi will be referred to as a splitting variable. For any set of inputs, only of the the terms (x1 AND g(x2, x3, . . . xn)) and (x1' AND h(x2, x3, . . . xn)) need to be evaluated. Therefore, if the splitting variable is chosen so the functions g and h are significantly easier to compute than F, then based on the value of xi, only one of the functions g or h need be computed.

In one embodiment of the invention, a PLA is split into two sub-PLAs based on the splitting variable. It should be noted that the PLA to be optimized for reduced power consumption can be split into more than two sub-PLAs. In this embodiment, The first sub-PLA will consist of those products in which the splitting variable appears in a complemented form. The second sub-PLA consists of those products in which the splitting variable is uncomplemented. The outputs of the two sub-PLAs are merged and form the logical equivalent to that of the original un-split PLA's outputs.

By way of example, using the example PLA previously presented, and using x2 as a splitting variable, the example PLA is split into two sub-PLAs having results, when merged, as illustrated in Table 2 and Table 3 below.

TABLE 2

| (Sub-PLA-a) | | | | | | | | | | |
|---|---|---|---|---|---|---|---|---|---|---|
| x1 | x2 | x3 | x4 | x5 | x6 | | y1$^a$ | y2$^a$ | y3$^a$ | y4$^a$ |
| m1 | — | 0 | 1 | — | 0 | — | / | 0 | 1 | 0 | 1 |
| m2 | 1 | 0 | 0 | 1 | — | — | / | 1 | 0 | 1 | 0 |

TABLE 3

| (Sub-PLA-b) | | | | | | | | | | |
|---|---|---|---|---|---|---|---|---|---|---|
| x1 | x2 | x3 | x4 | x5 | x6 | | y1$^b$ | y2$^b$ | y3$^b$ | y4$^b$ |
| m3 | — | 1 | — | 0 | 1 | — | / | 0 | 1 | 0 | 0 |
| m4 | — | 1 | — | 1 | — | 1 | / | 0 | 0 | 1 | 1 |

It should be noted that when x2=0 only sub-PLA-a needs to be evaluated because the result of evaluating sub-PLA-b is discarded by merging. It should also be noted that when x1=0, only sub-PLA-b needs to be evaluated. In this embodiment, power consumption is reduced by gating the clock. That is, by using circuitry to AND the clock with x2' for sub-PLA-a and by using circuitry to AND the clock with x2 for sub-PLA-b.

Figure 2:
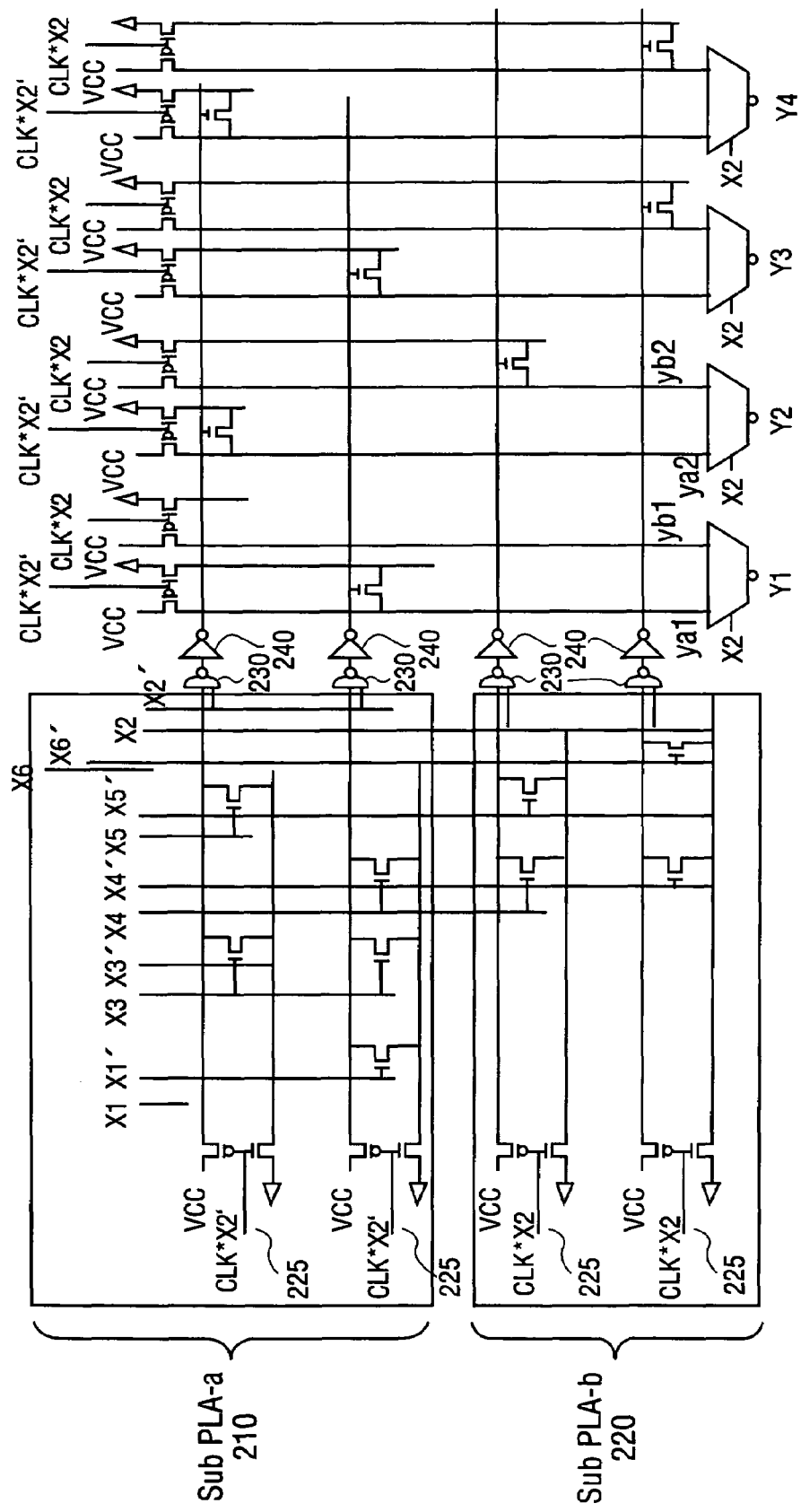
FIG. 2 illustrates the PLA illustrated in FIG. 1 that is split into two sub-PLAs using an embodiment of the invention.

FIG. 2 illustrates the PLA illustrated in FIG. 1 being split into two sub-PLAs, sub-PLA-a 210 and sub-PLA-b 220. For ease of explanation, the circuit illustrated in FIG. 2 will be evaluated with x2=1. With x2=1, CLK* x2 225 is equivalent to CLK 110. The lower product terms corresponding to sub-PLA-b 210 are clocked in the exact same way as in the original PLA illustrated in FIG. 1. The two upper products in sub-PLA-a 210, however, cannot discharge and will not toggle because their clocks are ANDed with x2'=0.

For sub-PLA-a 210, each NAND gate 230 has an input x2'=0. Therefore the output of each NAND gate 230 is one (1). The output of inverter 240, which is the value that is passed on to the OR plane, is 0 (zero). For sub-PLA-b 220, each NAND gate 250 has an input x2=1. Therefore, each NAND gate 250 acts similar to an inverter. Therefore, NAND gate 250 and inverter 260 cancel the functionality of the inversion. Therefore, the input of the OR plane is exactly the same as the output of the product in the original PLA illustrated in FIG. 1. It can be seen in FIG. 2 that the AND plane does not have inputs x2 and x2' in the same position as in FIG. 1. Also, it should be noted that, in FIG. 2, the transistors that were attached to the inputs in FIG. 1 are not necessary because when x2=1, the transistors attached to x2' are cut off.

As compared to the PLA illustrated in FIG. 1, the OR plane is extended horizontally in the embodiment of FIG. 2. The OR plane illustrated in FIG. 2 produces outputs yai and ybi (where i=1 to 4) side by side. That is, the OR planes of sub-PLA-a 210 and sub-PLA-b 220 are interleaved. It should be noted that while the area of the OR plane in FIG. 2 is double that of the OR plane illustrated in FIG. 1, only half of the OR plane is active, i.e. charging/discharging.

For ease of discussion, we will evaluate the OR plane with x2=1. Here, the outputs yai are coupled to a value of one (1) and cannot discharge. This is because the clock to the outputs are gated similar to the AND plane and cuts the output yai from ground and the transistors coupled to yai are turned off because they are in sub-PLA-a 210, and the signals from the AND plane that are attached to the gates of these transistors are low. Therefore, as long as x2=1, the signals yai are tied to the value one (1), but one should note, that this is of no consequence because since the selectors 260 at the bottom of the OR plane will select ybi anyway.

Thus, with x2=1, sub-PLA-a 210 is disabled and the only contribution to power consumption arises from sub-PLA-b 220. One skilled in the art will be able to see that when x2=0, the situation is reversed and only sub-PLA-a 210 contributes to power consumption.

The embodiment presented above in FIG. 2 thus has an extended OR plane resulting from interleaving the OR planes of the two sub-PLAs. This lengthens the OR plane by a factor of two (2) compared to the PLA illustrated in FIG. 1. Therefore, the total area increases. Also, the product wires are lengthened therefore increasing the product wires' capacitance and power consumed by them. This embodiment is very useful when the OR plane is narrow relative to the AND plane. Also, this embodiment is useful when the wire capacitance is low as compared to the total capacitance of the diffusion of attached devices. One skilled in the art will note that although the number of vertical wires through the OR plane has doubled due to generation of yai and ybi for each i, the increase does not result in a power increase because half of the wires do not toggle when x2 is held constant.

Further, for ease of understanding, the reduced power consumption will be broken down by the AND plane consumption and the OR plane consumption. In the AND plane, $P_x$ represents the power consumed by the xi and xi' signals that run vertical through the AND plane. For ease of discussion, the gate capacitances of the transistors attached to the signal wires will be ignored. $P_p^{AND}$ represents power consumption due to the portion of the product wires residing in the AND plane. $P_d^{AND}$ represents power consumption due to diffusion of the devices in the AND plane. In the OR plane, $P_y$ represents power consumed by the vertical yi wires. $P_p^{OR}$ represents power consumed due to the portion of the product wires residing in the OR plane. $P_d^{OR}$ represents power consumed due to the diffusion of the devices in the OR plane.

With these representations made, assuming sub-PLA-a 210 and sub-PLA-b 220 each consist of half the product wires and half the devices of the PLA illustrated in FIG. 1, then the partitioning to sub-PLA-a 210 and sub-PLA-b 220 from the original PLA will not affect $P_x$ or $P_y$, and will reduce $p_p^{AND}$, $P_d^{AND}$ and $P_d^{OR}$ components by roughly 50%. Also, $P_p^{OR}$ will increase by an amount that is dependent on the increase in the width of the OR plane.

Although the embodiment illustrated in FIG. 2 contains a number of additional elements, such as the additional NAND gates between AND and OR planes, one skilled in the art will realize that when x2 is held constant the number of devices whose capacitance is being discharged is reduced by roughly 50%. Therefore, this reduction leads to an increase in speed that offsets the additional components.

Figure 3:
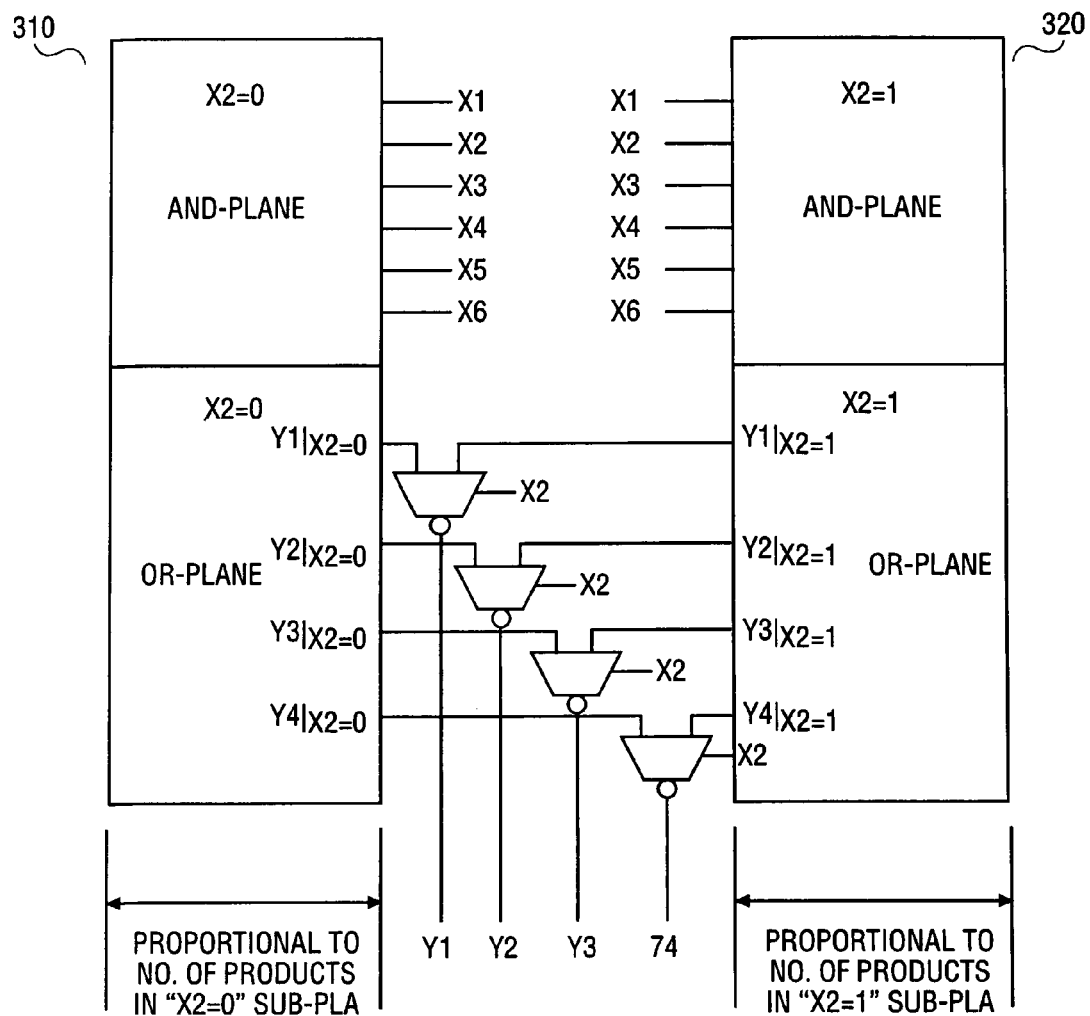
FIG. 3 illustrates a topological rearrangment of the PLA illustrated in FIG. 2 with the sub-PLAs separated.

FIG. 3 illustrates a topological rearrangement of the embodiment illustrated in FIG. 2. In this embodiment, two sub-PLAs, sub-PLA 310 and sub-PLA 320, are separated completely. That is, the OR planes are not interleaved as in the embodiment illustrated in FIG. 2. Because there is no interleaving, and consequently no elongation of the product wires in the OR plane, there is no loss of power consumption in $P_p^{OR}$. The gap between sub-PLA 310 and sub-PLA 320 causes some overhead in distributing the xi's to sub-PLA 310 and sub-PLA 320. This overhead is partially compensated for because the input wires that are used only in one sub-PLA do not incur the overhead of "passing over" the other sub-PLA, as is the case for x6 in the embodiment illustrated in FIG. 2. Also, there is some overhead in connecting yai with ybi over the gap. This overhead, however, is offset because each of these outputs has to cross over only one sub-PLA.

Therefore, the embodiment illustrated in FIG. 3 is an alternative to the embodiment illustrated in FIG. 2. The embodiment illustrated in FIG. 3 is especially useful in circuits where the outputs need to be placed in the middle of the structure.

Figure 4:
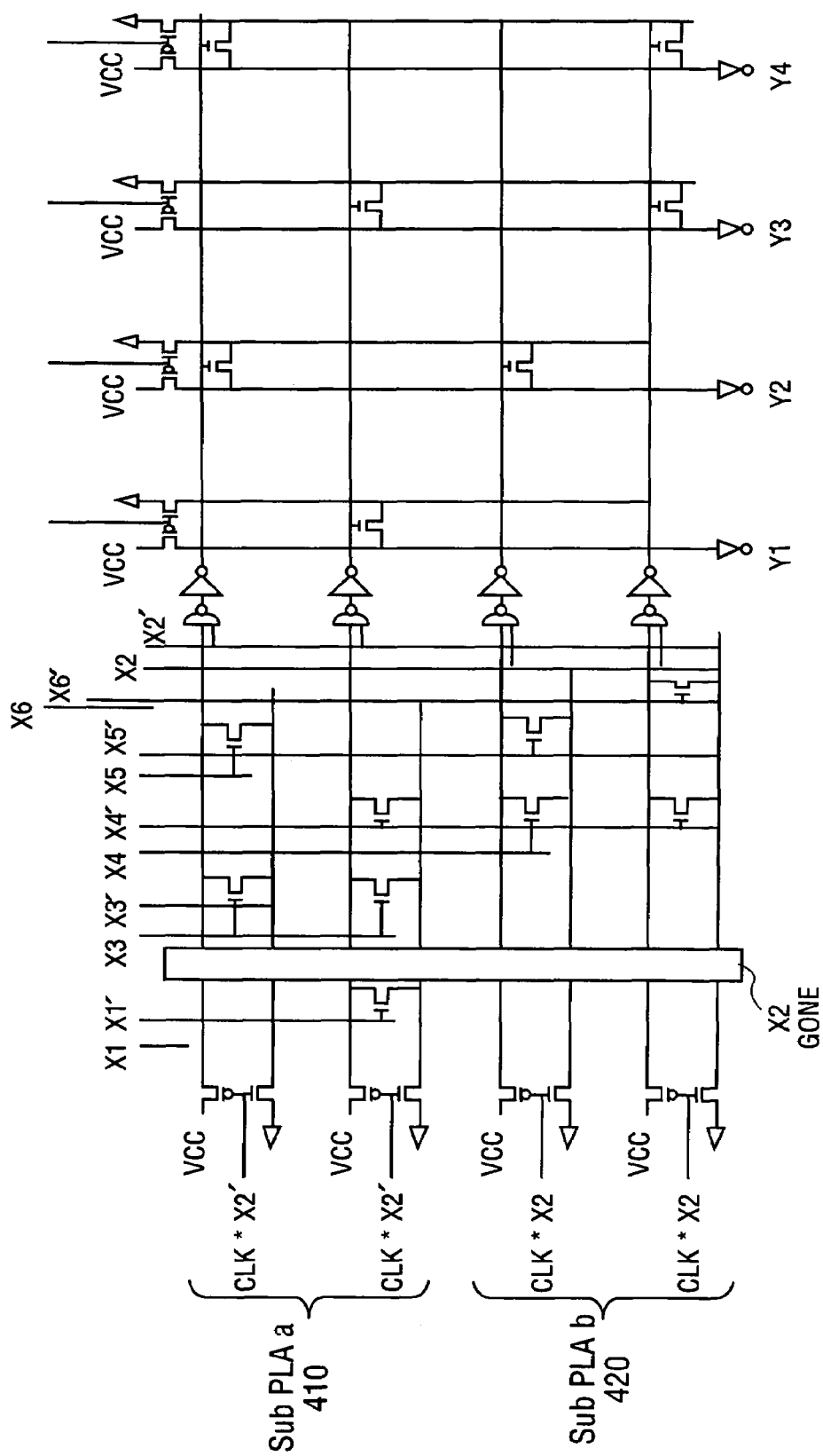
FIG. 4 illustrates a hybrid topological representation of the sub-PLAs illustrated in FIGS. 2 and 3.

FIG. 4 illustrates an embodiment that is a hybrid of the embodiments illustrated in FIGS. 2 and 3. One skilled in the art will note that the AND plane is identical to the embodiment illustrated in FIG. 2, including the NAND gates interposed between the AND and OR planes. Therefore, the discussion according to the AND plane of the embodiment illustrated in FIG. 2 applies to this embodiment as well. Thus, for x2=1, sub-PLA-a 410 is disabled, and the product terms going into the OR plane are equal to zero (0). Therefore, all the devices in the OR plane belonging to sub-PLA-a 410 are effectively cut-off. Thus, the values of the outputs, yi, are determined by sub-PLA-b 420, exclusively.

It should be noted that all PLA designs may have a race condition inherent in typical domino circuits. That is, when the signal following the inverter changes from a value of one (1) to a value of zero (0), part of the pre-charge on the yi output may escape during the transient. If the final value of the output is one (1), there may not be enough charge on the node to sustain this logic value. Therefore, a delay of the clock to the OR plane can be used to compensate for this condition.

Because of the AND plane being identical to the embodiment illustrated in FIG. 2, $P_x$ is unchanged from the original PLA illustrated in FIG. 1, and $P_p^{AND}$ and $P_d^{AND}$ are reduced by approximately 50%. The OR plane, however, is different here. Since the geometry of the OR plane is the same as that of the embodiment illustrated in FIG. 1, $P_y$ will be unchanged from the original PLA illustrated in FIG. 1, while $P_p^{OR}$ is reduced by approximately 50%. It is easily noticed, however, that unlike the embodiment illustrated in FIG. 2, there is no elongation of the product wires. Therefore, there will be no increase in the capacitance of these wires. One will note, however, that $P_d^{OR}$ remains unchanged from the original PLA that is illustrated in FIG. 1. $P_d^{OR}$ is reduced by approximately 50% in the embodiment of FIG. 2. Thus, the embodiment illustrated in FIG. 4 is preferred to that of the embodiment illustrated in FIG. 2 when the wire capacitance exceeds the capacitance due to OR-plane diffusion.

Figure 5:
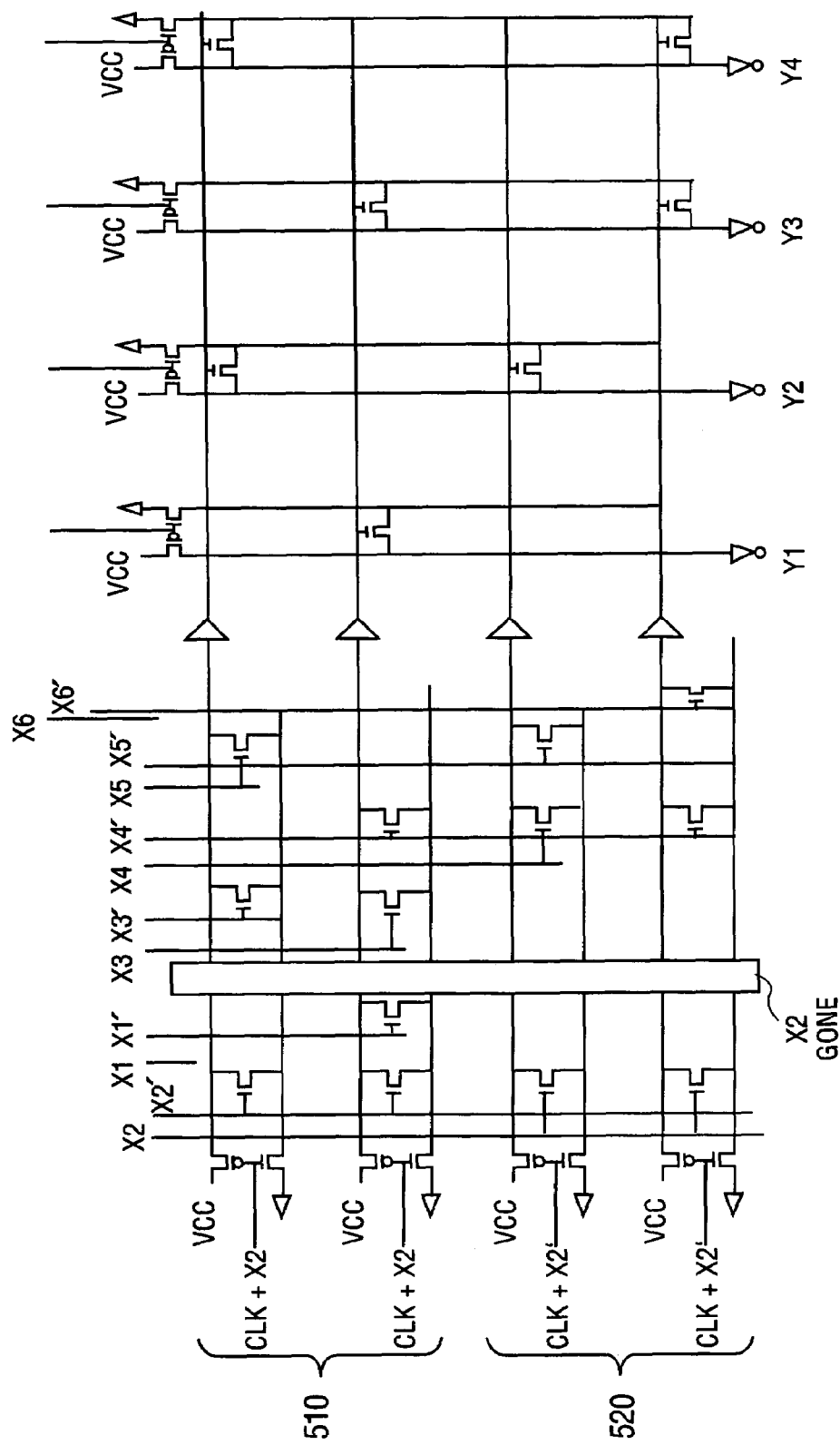
FIG. 5 illustrates a variation of the topological representation of the PLA illustrated in FIG. 4.

The embodiment illustrated in FIG. 5 illustrates a variation of the embodiment illustrated in FIG. 4. In this embodiment, the clocking scheme is different and the logic interposed between the AND and OR plane is no longer present. This results in the additional expense of devices at the left edge of the AND plane. When x2=0, the clock gating scheme enables the operation of sub-PLA 510 and the additional transistor is cut off. When x2=1, sub-PLA 510 is cut off from power and the additional device that is now turned on discharges the product node. This ensures the logic value of zero (0) at the input of the OR plane. It should be noted that care must be taken to maintain x=2 throughout the clock cycle to avoid false evaluations.

For ease of discussion, we shall assume the capacitance of the wires significantly exceeds that of the diffusion of devices attached to the wires. Also, that the horizontal and vertical pitches are equal. Thus, the total length of the horizontal wires equals the length of the vertical wires. With this, the power savings would amount to approximately 25%. This savings is due to an approximate 50% power savings on the horizontal wires, there is not a savings due to the vertical wires, and the horizontal wires constitute approximately 50% of the total capacitance.

By using x2 as the splitting variable, the PLA illustrated in FIG. 1 is split into two sub-PLAs, each approximately 50% the size of the original PLA. One skilled in the art will note that such a variable, x2, may not exist in reality. This is due to two factors. First, ones (1's) and zeroes (0's) in any column can be unbalanced. Secondly, the "don't cares" in any column need additional treatment. The choice of the i'th column (corresponding to the splitting variable xi) splits the set of rows of the original PLA into three subsets: the first consisting of rows which contain a zero (0) in the i'th column, sub-PLA-a; the second consisting of rows containing a one (1) in the i'th column, sub-PLA-b; and the third consisting of rows containing a dash ("don't care") in the i'th column. Therefore, when the splitting variable is x2, the third subset is empty. When the splitting variable chosen is x5, then sub-PLA-a would consist of row 0, sub-PLA-b would consist of row 3, and rows 2 and 4 would comprise a third sub-PLA c. In this case, whether x5 has a value of one (1) or zero (0), sub-PLA c has to be evaluated. Therefore, sub-PLA c can be joined to both sub-PLA-a and sub-PLA-b, creating a two-way split; but a two-way split in which the two sub-PLAs are not mutually exclusive.

Figure 6:
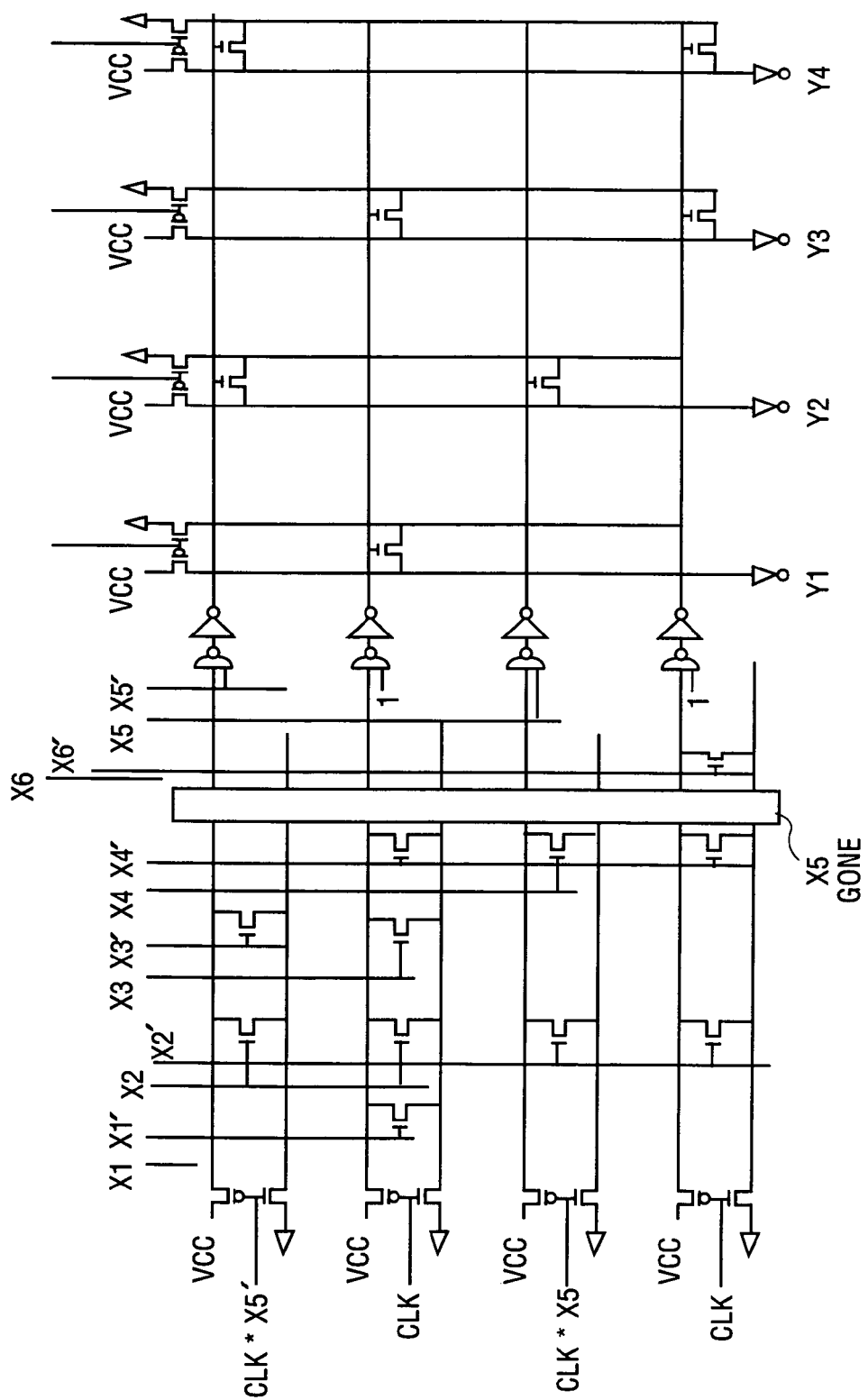
FIG. 6 illustrates an the PLA illustrated in FIG. 1 being split into sub-PLAs by an embodiment of the invention with x5 as a splitting variable.

In the embodiment illustrated in FIG. 6, with x5 as the splitting variable, the implementation is straightforward and only the gating of the clock needs to be changed. For sub-PLA-a which consists of the first row of the PLA illustrated in FIG. 6, the clock is gated by x5'. For sub-PLA-b, consisting of row 3, the clock is gated by x5. Because rows 2 and 4 have to be evaluated no matter what the value of x5 is, the clock to these products is not gated. The column corresponding to x2 reappears since we are not using x2 as the splitting variable. The column x5, corresponding to the chosen splitting variable, disappears. It should also be noted that there are some small changes to the logic between the AND and OR planes. In particular, the second and fourth product lines are logically equivalent to a buffer and are illustrated in FIG. 6 to show comparability with FIG. 2.

One skilled in the art will notice that even though this embodiment has less clock gating, power consumption is greater than the embodiment in which x2 is chosen as the splitting variable. The extra power consumption arises because instead of having a 50%–50% split of the product set, we now have a 75%–75% split. This is because with x5 as the splitting variable, roughly 75% of the product terms are active. Thus, it can be seen that choosing the splitting variable has a major impact on power consumption.

To assist in selecting the splitting variable, a heuristic can be used as follows. Let $z(j)$ equal the number of zeros in the j'th column of the AND plane, and $o(j)$ equal to the number of ones in the j'th column of the AND plane. Then the splitting variable is heuristically chosen as the variable index j that maximizes the value $\min(z(j), o(j))$. For ease of understanding this, let N denote the number of variables, and let $x(j)$ be equal to the number of "don't cares" in the j'th column of the AND plane. Then, for any j, $x(j)+o(j)+z(j)=N$, or $z(j)+o(j)=N-x(j)$. For any a,b, $\min(a,b)=0.5*(a+b-|a-b|)$. Therefore, $2*\min(z(j), o(j))=z(j)+o(j)-|z(j)-o(j)|$. By substituting the previous equation, the result is $2*\min(z(j), o(j))=N-[x(j)+|z(j)-o(j)|]$. Therefore, in order to maximize the value of $\min(z(j), o(j))$, the value of $x(j)+|z(j)-o(j)|$ needs to be minimized. In other words, for each index variable j, the equation $x(j)$=the number of "don't cares" in the j'th column of the AND plane, and score $(j)=x(j)+|z(j)-o(j)|$ is computed. Thus, the best column to chose would be the one with the lowest value of score. Note that in one embodiment, if there is a tie, the lowest value of j is used.

This heuristic steers away from unbalanced columns (by attempting to minimize the term $|z(j)-o(j)|$) and from columns with many "don't cares" (by attempting to minimize the term $x(j)$). Otherwise stated, from all the balanced columns, this criterion can select the column with the smallest overhead, and also from all the columns without "don't cares," it will favor the most balanced. Another way to view the splitting variable heuristic is as follows. After a split is based on the splitting variable i, the PLA will be split in two sub-PLAs of sizes $z(i)+x(i)$ and $o(i)+x(i)$, respectively. Therefore, in the worst case, the sub-PLA activated will be of size $\max(z(i)+x(i), o(i)+x(i))= N-\min(z(i), o(i))$. This value is then minimized across all indices i, $\min_i (N-\min(zi), o(i)))=N-\max_i (\min (z(i), o(i)))$. This means that the global minimum is achieved at the same index i at which $\min(z(i), o(i))$ attains maximum value. This is exactly the criterion as above.

Figure 7:
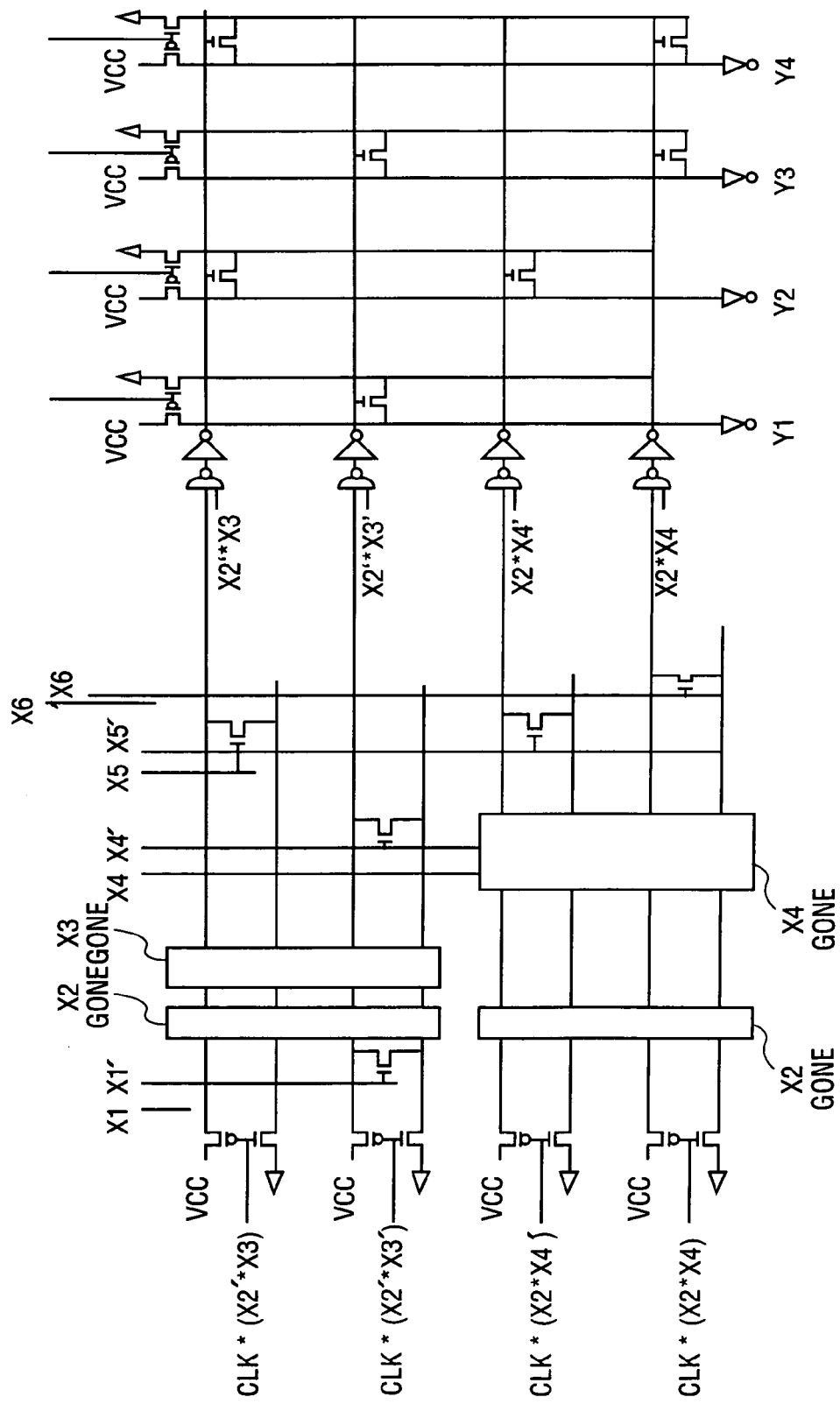
FIG. 7 illustrates the sub-PLAs illustrated in FIG. 2 being split recursively.

In another embodiment, the PLA can also be recursively split. Consider the split of the PLA illustrated in FIG. 1 which resulted in the embodiment illustrated in FIG. 2. One skilled in the art will recognize that if sub-PLA-a 410 (consisting of the first two rows) is considered as a separate PLA, then sub-PLA-a 410 can be split itself into two equal sub-PLAs, consisting of one row, by choosing x3 as a splitting variable. Likewise, sub-PLA-b 420 (consisting of rows 3 and 4) can be split into two one-row sub-PLAs by choosing x4 as a splitting variable. The resulting embodiment of this recursive splitting is illustrated in FIG. 7. One will note that the clock logic for this embodiment is different than the embodiment illustrated in FIG. 4.

From the embodiment illustrated in FIG. 7, it can be seen that there is more gating logic. This is because there are four different equations for signals gating the clock, as opposed to only two in the embodiment illustrated in FIG. 4. Also, each gating signal has more complex logic, which increases setup time. Many devices, however, have disappeared from the AND plane. Notice that for any set of inputs, x1 through x6, only one row (which corresponds to one sub-PLA) is active and the rest are disabled. In larger PLAs, the power consumption savings increases, and the principle of recursive splitting is valid for multi-level splitting.

It should be noted that each product in the recursively reduced structure, such as the embodiment illustrated in FIG. 7, is obtained from the corresponding product in the original PLA by omitting literals. Then the product of the literals that were omitted are used to gate the clock to the product. Thus, part of the dynamic logic of the AND gate is removed, and the remaining structure is converted into static logic to gate the clock. By doing so, the embodiment gains in power consumption reduction. It should be noted that setup time is increased because the static logic evaluation is performed before the precharge phase of the dynamic structure. In the extreme case when setup time is not important, one skilled in the art will notice that the entire AND plane can be removed and replaced with static logic, thus, gaining maximum power savings. When setup time is important, it is necessary to determine the appropriate splitting variable to maximize power savings. Thus, it is evident that the choice of splitting variable is important to reducing power consumption and minimizing setup time, simultaneously.

The above embodiments can also be stored on a device or medium and read by a machine to perform instructions. The device or medium may include a solid state memory device and/or a rotating magnetic or optical disk. The device or medium may be distributed when partitions of instructions have been separated into different machines, such as across an interconnection of computers.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for applying partitioning logic to partially optimized programmable logic arrays comprising:

determining an optimum splitting variable for dividing a programmable logic array (PLA) into at least two sub-PLAs by avoiding unbalanced columns in an AND plane of a set of equations representing the PLA; and selecting a column with smallest overhead in the AND plane of the set of equations representing the PLA, each sub-PLA of said at least two sub-PLAs having an AND plane and an OR plane, a first sub-PLA of said at least two sub-PLAs includes products in which said splitting variable is in complemented form, a second sub-PLA of said at least two sub-PLAs includes products in which said splitting variable is in uncomplemented form, said splitting variable corresponding to a specific input, output and product in the set of equations representing the PLA;

dividing the set of equations representing the PLA into a first set of equations representing the first sub-PLA and a second set of equations representing the second sub-PLA based on the splitting variable;

determining a topological circuit representation of the equations representing the first sub-PLA and the equations representing the second sub-PLA;

applying gating logic to the topological circuit representation of the equations representing the first sub-PLA and the equations representing the second sub-PLA; and controlling power consumption in the topological circuit representation of the equations representing the first sub-PLA and the equations representing the second sub-PLA so only one of the topological circuit representation of the first sub-PLA and the second sub-PLA contributes to power consumption, wherein an OR plane of the topological circuit representation of the first sub-PLA is interleaved with an OR plane of the topological circuit representation of the second sub-PLA.

2. The method of claim 1, wherein the PLA to be divided is partially optimized by computer aided design.

3. The method of claim 1, further comprising merging an output of the equations representing the first sub-PLA with an output of the equations representing the second sub-PLA, wherein merging the output of the equations representing the first sub-PLA with the equations representing the second sub-PLA forms a logical equivalent of the PLA.

4. The method of claim 1, wherein the equations representing the first sub-PLA includes a plurality of products where the splitting variable is complemented and the equations representing the second sub-PLA includes a plurality of products where the splitting variable is uncomplemented.

5. The method of claim 1, further comprising delaying a clock to an OR plane of one of the topological circuit representation of the first sub-PLA and the topological circuit representation of the second sub-PLA.

6. The method of claim 1, wherein determining a topological circuit representation of first sub-PLA and the second sub-PLA is created by computer aided design.

7. A method for applying partitioning logic to partially optimized programmable logic arrays comprising:
   determining an optimum splitting variable for dividing a set of equations representing a programmable logic array (PLA) into equations representing at least two sub-PLAs by avoiding unbalanced columns in an AND plane of the equations representing the PLA; and selecting a column with smallest overhead in the AND plane of the equations representing the PLA, each sub-PLA of said at least two sub-PLAs having an AND plane and an OR plane, a first sub-PLA of said at least two sub-PLAs includes products in which said splitting variable is in complemented form, a second sub-PLA of said at least two sub-PLAs includes products in which said splitting variable is in uncomplemented form, said splitting variable corresponding to a specific input, output and product in the set of equations representing the PLA;
   dividing the set of equations representing the PLA into equations representing the at least two sub-PLAs;
   merging outputs of the equations representing the at least two sub-PLAs;
   determining a topological circuit representation of the equations representing the at least two sub-PLAs;
   applying gating logic to the topological circuit representation of the at least two sub-PLAs; and
   controlling power consumption in the topological representation of the at least two sub-PLAs so only one of the at least two sub-PLAs contributes to power consumption,
wherein an OR plane of the topological circuit representation of a first sub-PLA is one of interleaved and separated with an OR plane of the topological circuit representation of a second sub-PLA.

8. The method of claim 7, wherein the PLA to be divided is partially optimized by computer aided design.

9. The method of claim 7, wherein the equations representing the plurality of sub-PLAs are divided recursively based on a determined optimum splitting variable for each equation representing a sub-PLA.

10. The method of claim 9, wherein each product of the equations representing the plurality of sub-PLAs is obtained by omitting literals in the equations representing the PLA.

11. The method of claim 10, wherein a product of the omitted literals is used in the topological circuit representation of the plurality of sub-PLAs to gate a clock of each product of the plurality of sub-PLAs.

12. The method of claim 9, wherein the step of determining the optimum splitting variable for each of the equations representing the sub-PLA further comprises avoiding unbalanced columns in an AND plane of the equations representing the sub-PLA; and selecting a column with smallest overhead in the AND plane of the equations representing the sub-PLA.

13. A program storage device readable by a machine comprising instructions that cause the machine to:
   determine an optimum splitting variable for dividing a programmable logic array (PLA) into a first sub-PLA and a second sub-PLA by avoiding unbalanced columns in an AND plane of a set of equations representing the PLA; and selecting a column with smallest overhead in the AND plane of the set of equations representing the PLA, said first sub-PLA and said second sub-PLA each have an AND plane and an OR plane, the first sub-PLA includes products in which said splitting variable is in complemented form, the second sub-PLA includes products in which said splitting variable is in uncomplemented form, said splitting variable corresponding to a specific input, output and product in the set of equations representing the PLA;
   divide the set of equations representing the PLA into a first set of equations representing the first sub-PLA and a second set of equations representing the second sub-PLA based on the splitting variable;
   determine a topological circuit representation of first sub-PLA and the second sub-PLA;
   apply gating logic to the topological circuit representation of the first sub-PLA and the second sub-PLA; and
   control power consumption in the topological circuit representation of the first sub-PLA and the second sub-PLA so only one of the first sub-PLA and the second sub-PLA contributes to power consumption,
wherein the topological circuit representation an OR plane of the first sub-PLA is interleaved with an OR plane of the second sub-PLA.

14. The program storage device of claim 13, wherein the PLA to be divided is partially optimized by computer aided design.

15. The program storage device of claim 13, further comprising instructions that cause the machine to merge an output of the equations representing the first sub-PLA with an output of the equations representing the second sub-PLA, wherein the instruction that causes the machine to merge the output of the equations representing the first sub-PLA with the equations representing the second sub-PLA, forms a logical equivalent of the equations representing the PLA.

16. The program storage device of claim 13, wherein the equations representing the first sub-PLA includes a plurality of products where the splitting variable is complemented and the equations representing the second sub-PLA includes a plurality of products where the splitting variable is uncomplemented.

17. A program storage device readable by a machine comprising instructions that cause the machine to:
   determine an optimum splitting variable for dividing a set of equations representing a programmable logic array (PLA) into equations representing at least two sub- PLAs by avoiding unbalanced columns in an AND plane of the equations representing the sub-PLA and selecting a column with smallest overhead in the AND plane of the equations representing the sub-PLA, each sub-PLA of said at least two sub-PLAs having an AND plane and an OR plane, a first sub-PLA of said at least two sub-PLAs includes products in which said splitting variable is in complemented form, a second sub-PLA of said at least two sub-PLAs includes products in which said splitting variable is in uncomplemented form, said splitting variable corresponding to a specific input, output and product in the set of equations representing the PLA;

divide the set of equations representing the PLA into equations representing the at least two sub-PLAs;

merge outputs of the equations representing the at least two sub-PLAs;

determine a topological circuit representation of the equations representing the at least two sub-PLAs;

apply gating logic to the topological circuit representation of the at least two sub-PLAs; and control power consumption in the topological circuit representation of the at least two sub-PLAs so only one of the at least two sub-PLAs contributes to power consumption, wherein an OR plane of the topological circuit representation of a first sub-PLA is one of interleaved and separated with an OR plane of the topological circuit representation of a second sub-PLA.

18. The program storage device of claim 17, wherein the PLA to be divided is partially optimized by computer aided design.

19. The program storage device of claim 17, wherein the instruction causing the machine to divide the equations representing the plurality of sub-PLAs divides recursively based on a determined optimum splitting variable for each equation representing a sub-PLA.

20. The program storage device of claim 17, wherein the instruction causing the machine to determine the optimum splitting variable further comprises avoiding unbalanced columns in an AND plane of the equations representing the PLA; and selecting a column with smallest overhead in the AND plane of the equations representing the PLA.

21. A method for applying partitioning logic to partially optimized programmable logic arrays comprising:

determining an optimum splitting variable for dividing a programmable logic array (PLA) into a first sub-PLA and a second sub-PLA, said first sub-PLA and said second sub-PLA each having an AND plane and an OR plane by avoiding unbalanced columns in an AND plane of a set of equations representing the PLA; and selecting a column with smallest overhead in the AND plane of the set of equations representing the PLA, the first sub-PLA includes products in which said splitting variable is in complemented form, the second sub-PLA includes products in which said splitting variable is in uncomplemented form, said splitting variable corresponding to a specific input, output and product in a set of equations representing the PLA;

dividing the set of equations representing the PLA into a first set of equations representing the first sub-PLA and a second set of equations representing the second sub-PLA based on the splitting variable;

determining a topological circuit representation of the equations representing the first sub-PLA and the equations representing the second sub-PLA;

applying gating logic to the topological circuit representation of the equations representing the first sub-PLA and the equations representing the second sub-PLA; and controlling power consumption in the topological circuit representation of the equations representing the first sub-PLA and the equations representing the second sub-PLA so only one of the topological circuit representation of the first sub-PLA and the second sub-PLA contributes to power consumption, wherein an OR plane of the topological circuit representation of the first sub-PLA is separated from an OR plane of the topological circuit representation of the second sub-PLA.

22. The method of claim 21, wherein the PLA to be divided is partially optimized by computer aided design.

23. The method of claim 21, further comprising merging an output of the equations representing the first sub-PLA with an output of the equations representing the second sub-PLA, wherein merging the output of the equations representing the first sub-PLA with the equations representing the second sub-PLA forms a logical equivalent of the PLA.

24. The method of claim 21, wherein the equations representing the first sub-PLA includes a plurality of products where the splitting variable is complemented and the equations representing the second sub-PLA includes a plurality of products where the splitting variable is uncomplemented.

25. The method of claim 21, further comprising delaying a clock to an OR plane of one of the topological circuit representation of the first sub-PLA and the topological circuit representation of the second sub-PLA.

26. The method of claim 21, wherein determining a topological circuit representation of first sub-PLA and the second sub-PLA is created by computer aided design.

27. A program storage device readable by a machine comprising instructions that cause the machine to:

determine an optimum splitting variable for dividing a programmable logic array (PLA) into a first sub-PLA and a second sub-PLA, said first sub-PLA and said second sub-PLA each having an AND plane and an OR plane by avoiding unbalanced columns in an AND plane of a set of equations representing the PLA; and selecting a column with smallest overhead in the AND plane of the set of equations representing the PLA, the first sub-PLA includes products in which said splitting variable is in complemented form, the second sub-PLA includes products in which said splitting variable is in uncomplemented form, said splitting variable corresponding to a specific input, output and product in a set of equations representing the PLA;

divide the set of equations representing the PLA into a first set of equations representing the first sub-PLA and a second set of equations representing the second sub-PLA based on the splitting variable;

determine a topological circuit representation of the first sub-PLA and the second sub-PLA;

apply gating logic to the topological circuit representation of the first sub-PLA and the second sub-PLA; and control power consumption in the topological circuit representation of the first sub-PLA and the second sub-PLA so only one of the first sub-PLA and the second sub-PLA contributes to power consumption, wherein in the topological circuit representation an OR plane of the first sub-PLA is separated from an OR plane of the second sub-PLA.

28. The program storage device of claim 27, wherein the PLA to be divided is partially optimized by computer aided design.

29. The program storage device of claim 27, further comprising instructions that cause the machine to merge an output of the equations representing the first sub-PLA with an output of the equations representing the second sub-PLA, wherein the instruction that causes the machine to merge the output of the equations representing the first sub-PLA with the equations representing the second sub-PLA, forms a logical equivalent of the equations representing the PLA.

30. The program storage device of claim 27, wherein the equations representing the first sub-PLA includes a plurality of products where the splitting variable is complemented and the equations representing the second sub-PLA includes a plurality of products where the splitting variable is uncomplemented.

* * * * *